United States Patent [19]
Ohyu

[11] Patent Number: 5,668,472
[45] Date of Patent: Sep. 16, 1997

[54] MULTICHANNEL FLUX MEASURING APPARATUS HAVING FUNCTION FOR COMPENSATING INTERFERENCE DUE TO CROSSTALK

[75] Inventor: Shigeharu Ohyu, Otawara, Japan

[73] Assignee: Kabushiki Kaisha Toshiba, Kawasaki, Japan

[21] Appl. No.: 503,337

[22] Filed: Jul. 17, 1995

[30] Foreign Application Priority Data

Jul. 18, 1994 [JP] Japan .................................. 6-165166

[51] Int. Cl.$^6$ ........................ G01R 33/035; G01R 33/02
[52] U.S. Cl. ........................ 324/248; 505/846; 327/527
[58] Field of Search ........................ 324/248, 244; 505/845, 846; 327/510, 527

[56] References Cited

U.S. PATENT DOCUMENTS

| | | | |
|---|---|---|---|
| 4,761,611 | 8/1988 | Hoenig | 324/248 |
| 4,825,162 | 4/1989 | Roemer et al. | 324/318 |
| 5,038,104 | 8/1991 | Wikswo, Jr. et al. | 324/248 X |
| 5,319,307 | 6/1994 | Simmonds | 324/248 |
| 5,326,986 | 7/1994 | Miller, Jr. et al. | 324/248 X |
| 5,453,690 | 9/1995 | Kruger et al. | 324/248 |

FOREIGN PATENT DOCUMENTS 3-77082  4/1991  Japan .

OTHER PUBLICATIONS

Clarke, Principles and Applications of SQUIDs, Proceedings of the IEEE, vol. 77, No. 8, Aug. 1989, pp. 1208–1223.

Primary Examiner—Sandra L. O'Shea
Assistant Examiner—Roger C. Phillips
Attorney, Agent, or Firm—Oblon, Spivak, McClelland, Maier & Neustadt, P.C.

[57] ABSTRACT

Flux of magnetic field generated from an object P of magnetic measurement, which links with the pick-up coils of the fluxmeters, where the flux is converted into electrical signals by each of the SQUID chips driven by the FLL circuits. The electrical signals are sent to the data collection unit via the signal processing circuit. In the data collection unit, the electrical signals are converted into digital data by the A/D converter. The converted digital data are recorded on a hard disk or a magnet-optical disk or the like, of the data recording section. The digital data recorded on the data recording medium are compensated with use of a crosstalk compensation matrix so as to remove the interference due to crosstalk for each channel, by the crosstalk compensation section. The compensated data are displayed directly on the display in the form of a magnetic field distribution or time waveform, and sent to the data analysis section. The data sent to the data analysis section are subjected to a process for obtaining a current source distribution of the living body or the like, and then displayed on the display.

8 Claims, 5 Drawing Sheets

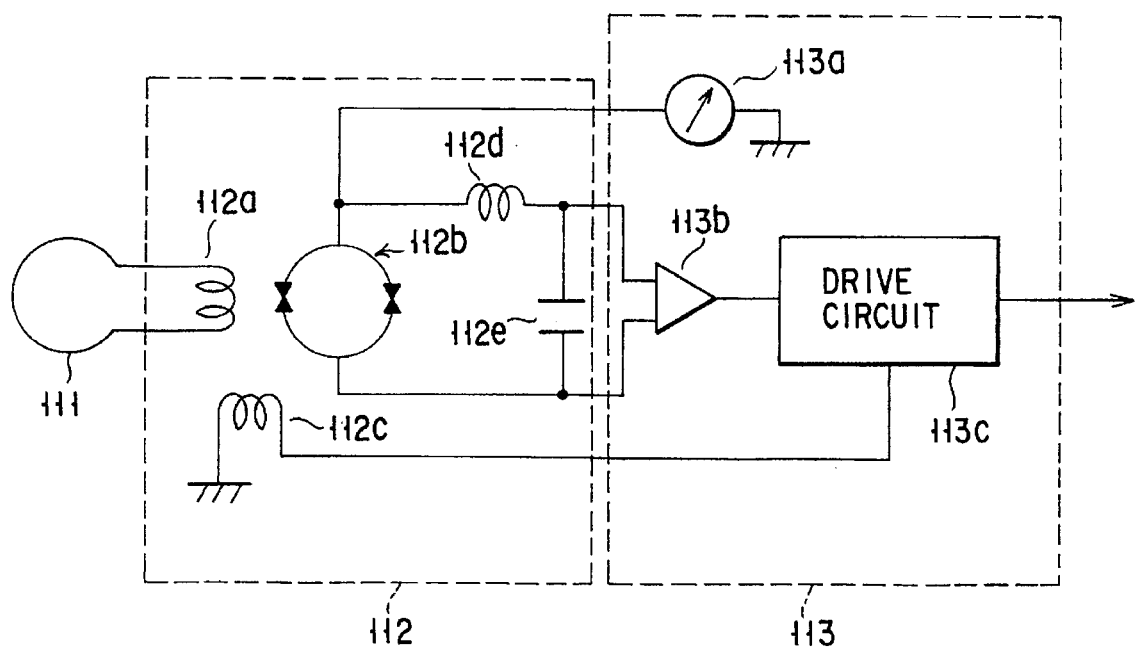
FLUXMETER 110
F I G. 4

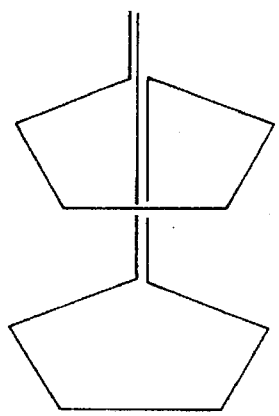
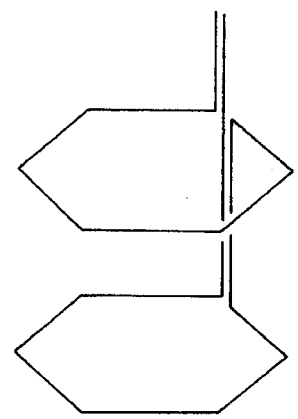
F I G. 8A    F I G. 8B
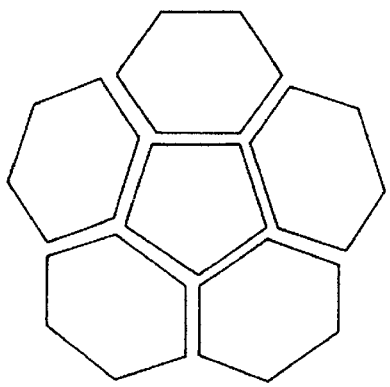
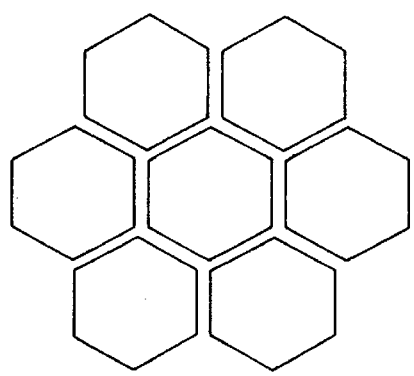
F I G. 8C    F I G. 8D
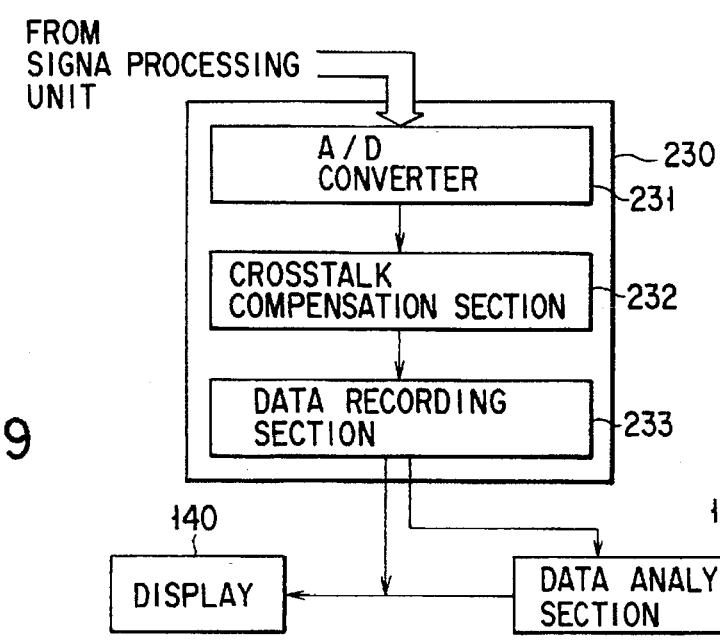
F I G. 9

MULTICHANNEL FLUX MEASURING APPARATUS HAVING FUNCTION FOR COMPENSATING INTERFERENCE DUE TO CROSSTALK

BACKGROUND OF THE INVENTION

1. Field of the Invention

The present invention relates to a multichannel SQUID flux measuring apparatus for detecting a magnetic field of an object of flux measurement by measuring flux emitted from the object of flux measurement, such as brain or heart, by use of a plurality of SQUIDs (superconducting quantum interference devices), and more specifically, to a multichannel flux measuring apparatus having a function for compensating an interference due to a crosstalk between a plurality of channels.

2. Description of the Related Art

A method of detecting a magnetic field of an object to be measured, that is, so-called biomagnetic measurement, is known as a method of detecting an internal state of a human living body from outside. Regarding the biomagnetic measurement, since the intensity of the flux radiated from the living body is one ten thousandth to one hundred millionth of that of terrestrial magnetism ($0.5 \times 10^{-4}$ T (Tesla)), there is a demand of a technique for detecting a very weak flux. Recently, as a technique for detecting such a very weak flux, a flux measuring apparatus using a SQUID (superconducting quantum interference device), which is an application of the superconducting electronics, is brought into focus.

FIG. 1 is a diagram showing the main structure of a conventional multichannel SQUID flux measuring apparatus using a plurality of the above-described SQUIDs.

As shown in FIG. 1, the conventional SQUID flux measuring apparatus includes a plurality of fluxmeters 1 (the n number in FIG. 1) (1-1 to 1-n), a signal processing circuit 2, a data collecting portion 3, a display 4 and a data analyzing portion 5. Each of the magnetic fluxmeters 1 (1-1 to 1-n) has a corresponding one of pick-up coils 11 (11-1 to 11-n), a corresponding one of SQUID chips 12 (12-1 to 12-n) and a corresponding one of FLL (flux locked loop) circuits 13 (13-1 to 13-n). For example, the fluxmeter 1-1 includes the pick-up coil 11-1, the SQUID chip 12-1, and the FLL circuit 13-1. That is, the magnetic measurement apparatus shown in FIG. 1 is an n-channel SQUID fluid measuring apparatus in which each of the fluxmeters 1-1 to 1-n serves as a unit channel.

The pick-up coils 11-1 to 11-n are, for example, as shown in FIG. 2A, two-dimensionally arranged at a predetermined interval so as to cover the surface of an object P of flux measurement (head portion of a patient). It should be noted that it is seen in FIG. 2A that pick-up coils 11-1 to 11-n are arranged in line since this figure is a side view; however, in reality, they are arranged in a curved-surface manner and in a two-dimensional array manner so as to cover the surface of the object P of flux measurement, as shown in FIG.

The SQUID chips 12-1 to 12-n of the fluxmeters 1-1 to 1-n each has an input coil, a modulation coil and the like. The power to these coils is controlled by the corresponding FLL circuit 13, and the corresponding SQUID chip 12 is driven.

In each of the fluxmeters 1-1 to 1-n, the flux (flux density) which are emitted from the object P of flux measurement and are linked within the pick-up coil 11, is converted into a corresponding electrical signal (analog signal) by the SQUID chip 12 driven by the FLL circuit 13. The converted electrical signal is output from the FLL circuit 13. Electrical signals output from the fluxmeters 1-1 to 1-n, that is, electrical signals output from the FLL circuits 13-1 to 13-n are all sent to the signal processing circuit 2.

The electrical signals output from the fluxmeters 1-1 to 1-n are treated in the signal processing circuit 2 so that they can be sent to the data collecting unit 3, and then the signals are sent to a data collecting unit 3. The data collecting unit 3 includes an A/D (analog/digital) converter 31, a data recording section 32 and the like, and the input electrical signals (analog signal) are converted into digital data by the A/D converter 31. The converted digital data are recorded/saved in a non-volatile recording medium such as a hard disk in the data recording section 32.

The digital data recorded on the non-volatile recording medium are displayed directly on a display 4 in the form of a magnetic field distribution or time waveform, and once transferred to the data analysis section 5. The data transferred to the data analysis unit 5 are subjected to an analyzing process, for example, the detection of the distribution of one or more current sources in a living body, and then the data are displayed on the display 4.

In such a conventional multichannel SQUID flux measuring apparatus, a great number of, for example, 100 or more, SQUID fluxmeters each consisting of a pick-up coil, a SQUID chip and an FLL circuit and serving as a unit channel, are provided. With this structure, magnetic fields of a great number of points to be measured are measured at the same time in measurement of biomagnetic field (for example, brain or heart).

However, the above-described multichannel SQUID flux measuring apparatus has a great number of pick-up coils and SQUID chips, and therefore inter-channel magnetic interactions occur in the pick-up coils, the wiring connecting pick-up coils and SQUID chips, and the SQUID chips. That is, a signal flowing in an arbitrary channel and a linking flux interfere a signal flowing in another channel, and in reverse, a signal flowing in another channel and linking flux interfere the arbitrary channel. Such a phenomenon is called crosstalk, and a crosstalk causes an undesirable error in measurement of magnetic field.

The main factor which causes such a crosstalk is a magnetic interaction between pick-up coils. In the conventional multichannel SQUID flux measuring apparatus, the distance between pick-up coils of channels is rendered long in order to lessen the magnetic interaction. However, in the case where the area to be measured (measurement range) is constant, it is required to reduce the number (channel number) of pick-up coils or reduce the coil diameter of each pick-up coil for increasing the distance between the pick-up coils. When the number of pick-up coils is decreased, the number of measurement points provided in the measurement area is accordingly reduced, thus lowering the accuracy of the magnetic field measurement. When the coil diameter of each pick-up coil is reduced, the coil area of each pick-up coil with which flux links, is reduced, thus lowering the accuracy of the flux measurement of each coil (the signal-to-noise ratio, that is, S/N ratio is deteriorated).

As described above, in the case of the conventional multichannel flux measuring apparatus, if some measures are taken to lessen the interference due to crosstalk, some other problems than the interference due to the crosstalk are created. As a result, the measures taken are always insufficient.

SUMMARY OF THE INVENTION

The object of the present invention is to provide a multichannel flux measuring apparatus having a plurality of pick-up coils and capable of preventing an interference due to crosstalk without decreasing the accuracy of the flux measurement and magnetic field measurement.

According to the first aspect of the present invention, there is provided A flux measuring apparatus comprising: a plurality of measuring means each having a pick-up coil and detection means for detecting flux linked with the pick-up coil, the detection means including a superconductor quantum interference device (SQUID); and compensation means for compensating an interference due to a crosstalk between the plurality of pick-up coils for the flux detected by the detection means on the basis of a self inductance of each pick-up coil and a mutual inductance between pick-up coils of the plurality of measuring means.

According to the second aspect of the present invention, there is provided A flux measuring apparatus comprising: a plurality of measuring means each having a pick-up coil and detection means for detecting flux linked with the pick-up coil, the detecting means including a superconductor quantum interference device (SQUID); and compensation means for compensating an interference due to a crosstalk between the plurality of pick-up coils for the flux detected by the detection means on the basis of a theoretical value and a measured value obtained by the measuring means regarding a known current source.

The magnetic flux measuring apparatus having the above-described structure, includes a compensation unit for compensating signals output from fluxmeters (measuring units) each constituting a single channel, that is, removing the interference by crosstalk mixed in the data obtained from each signal. Thus, the interference by crosstalk generated between the pick-up coils is removed, and only the flux which is free of the interference by the crosstalk can be measured from the object to be measured. Especially, the flux measuring apparatus according to the first aspect, is effective for the magnetic interaction between pick-up coils, which is a main cause of crosstalk. Further, the flux measuring apparatus according to the second aspect is effective for all the factor in crosstalk between the fluxmeters. Thus, the interference by crosstalk can be significantly reduced without treatments such as increasing the distance between pick-up coils and decreasing the diameter of each pick-up coil. In other words, the interference by crosstalk can be reduced without deteriorating the accuracy of the magnetic measurement or the magnetic field measurement, thus making it possible to improve the reliability of the flux measuring apparatus.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 4 is a block diagram showing the detailed structure of a magnetic fluxmeter of the multichannel magnetic measuring apparatus shown in FIG. 3;

FIGS. 8A to 8D are diagrams showing examples of the shape of a pick-up coil which can be used in the multichannel flux measuring apparatus shown in FIG. 3 and examples of the arrangement of the pick-up coils having the above shape; and FIG. 9 is a block diagram showing the structure of a different version of the data collecting unit of the multichannel measuring apparatus shown in FIG. 3.

DETAILED DESCRIPTION OF THE PREFERRED EMBODIMENTS

The first and second embodiments of the multichannel flux measuring apparatus according to the present invention will now be described with reference to accompanying drawings.

Figure 3:
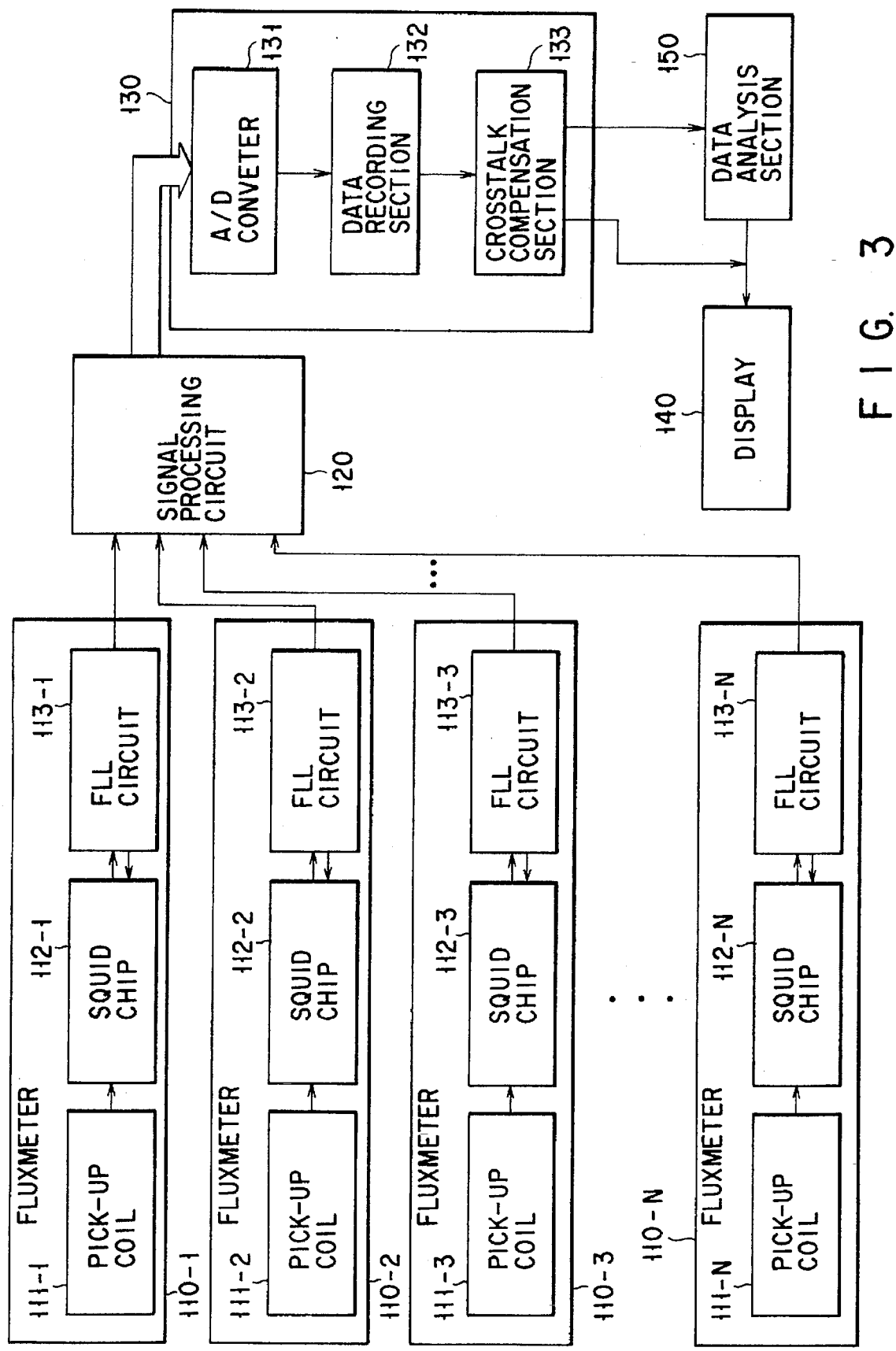
FIG. 3 is a block diagram showing the structure of a multichannel flux measuring apparatus according to the first embodiment of the present invention.

FIG. 3 shows the structure of the first embodiment of the multichannel flux measuring apparatus. As shown in FIG. 3, the multichannel flux measuring apparatus consists of a plurality of (the N number in the first embodiment) fluxmeters 110 (110-1 to 110-N), a signal processing circuit 120, a data collecting unit 130, a display 140 and a data analysis section 150. The fluxmeters 110 (110-1 to 110-N) has the same structure respectively including pick-up coils 111 (111-1 to 111-N), SQUID chips 112 (112-1 to 112-N) and FLL (flux locked loop) circuits 113 (113-a to 113-N). For example, the fluxmeter 110-1 consists of the pick-up coil 111-1, the SQUID chip 112-1 and the FLL circuit 113-1. That is, the flux measuring apparatus shown in FIG. 3 is an N-channel SQUID flux measuring apparatus in which the fluxmeters 110-1 to 110-n each constitute a unit channel.

Figure 1:
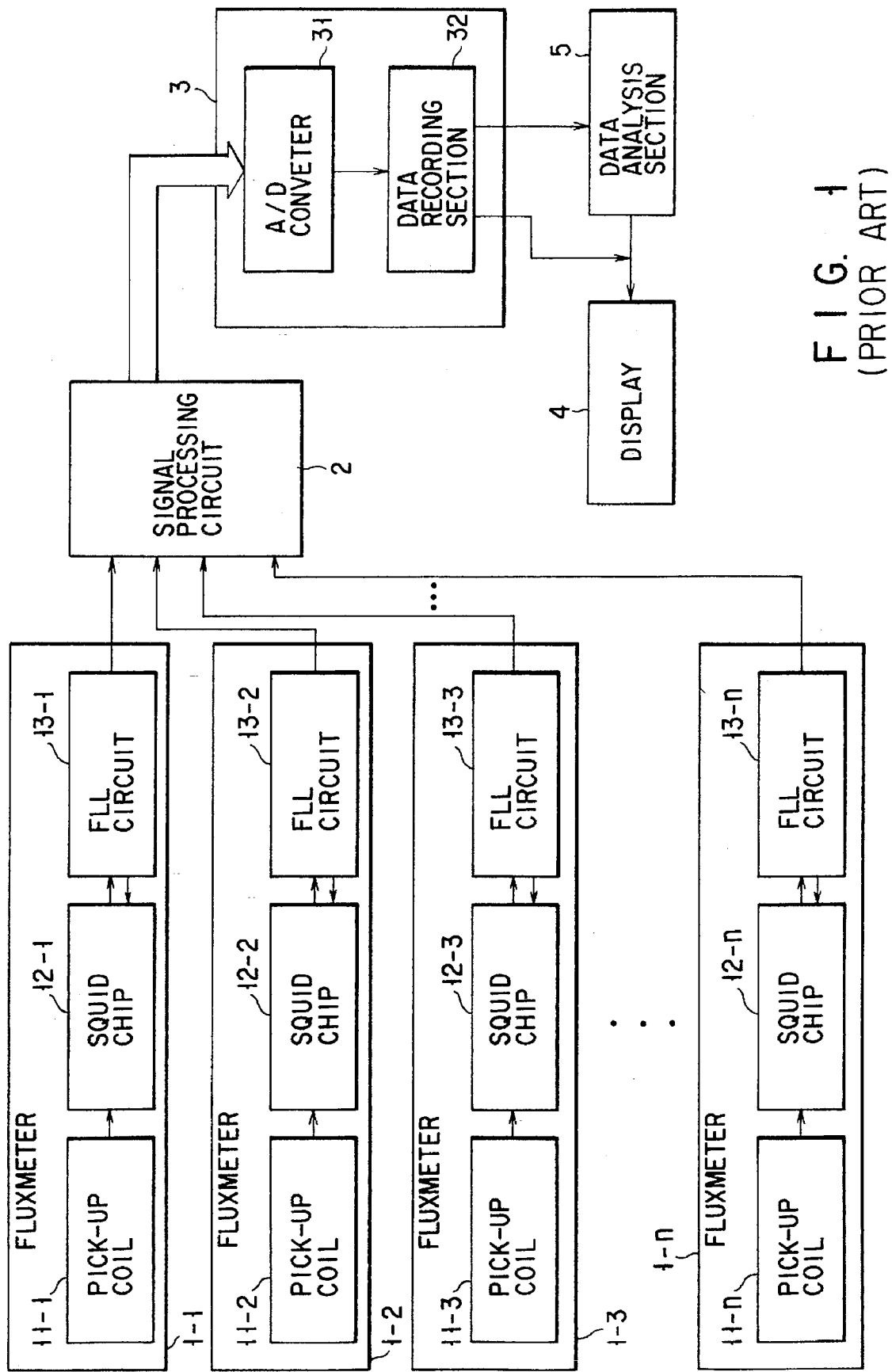
FIG. 1 is a block diagram showing the structure of a conventional multichannel magnetic flux measuring apparatus.
Figure 2A:
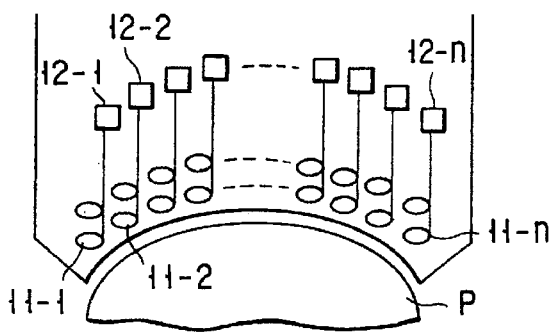
FIGS. 2A and 2B are diagrams illustrating the state in which a plurality of pick-up coils are arranged on the head portion to be measured in connection with the conventional multichannel flux measuring apparatus.
Figure 2B:
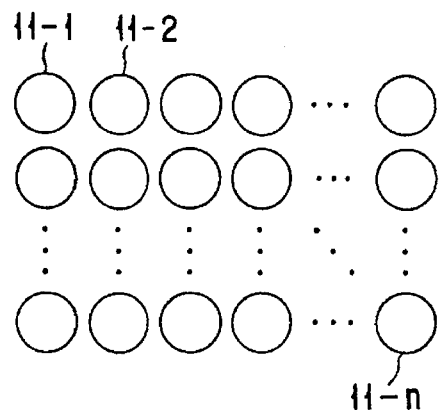
Figure 6:
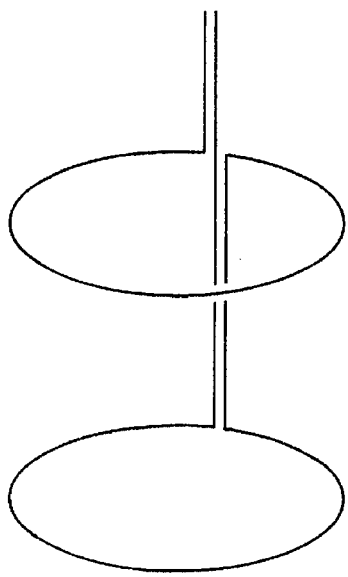
FIG. 6 is a diagram showing a primary differential-type pick-up coil applied to the multichannel magnetic flux measuring apparatus shown in FIG. 3.

Each of the fluxmeters 110 (110-1 to 110-N) has the structure shown in FIG. 4. FIG. 4 shows, as an example of the fluxmeter, a so-called DC-SQUID which can be operated by a DC bias. In FIG. 4, the pick-up coil 111 is used to directly detect a magnetic field generated from a living body to be measured. A primary differential-type coil shown in, for example, FIG. 6, is applied to the pick-up coil 111. In a measurement, the pick-up coils 111-1 to 111-N are two-dimensionally arranged at a predetermined interval so as to cover the surface of an object of flux measurement, in similar to the conventional pick-up coils 11-1 to 11-n shown in FIGS. 2A and 2B. Each SQUID chip 112 converts the flux (flux density) linked with the corresponding pick-up coil 111 into electrical signals. Each FLL circuit 113 supplies power to the corresponding SQUID chip 112.

As shown in FIG. 4, each SQUID chip 112 is constituted to include an input coil 112a, a SQUID ring 112b, a modulation coil (feedback coil) 112c, a coil 112d and a capacitor 112e. Each FLL circuit 113 is constituted to include a DC power source 113a, an amplifier 113b and a driving circuit 113c.

In such a fluxmeter 110, a magnetic field directly detected by a pick-up coil 111, that is, a magnetic field linked with a pick-up coil 111, is transmitted to the SQUID ring 112b via the input coil 112a connected in series to this pick-up coil 111. This SQUID ring 112b has two Josephson elements, and bias current is supplied to the ring in advance from the DC current 113a. In general, in the case where a magnetic field is applied to a superconducting ring from outside, a current flows through the ring as if an opposite magnetic filed were created, thus canceling the magnetic field created in the ring. Such a current is called a screening current, and the amount of the current is proportional to the intensity of the magnetic field (flux density) entering the ring from outside. Therefore, when a magnetic field enters the SQUID ring 112b, a screening current is applied to the bias current. One of the currents flowing through the two Josephson elements is a sum of the bias current and the screening current and the other is a different therebetween. Due to the difference between the currents flowing through the two Josephson elements, a voltage is generated at a connection terminal of the SQUID ring 112b, and this voltage is applied to the amplifier 112b via the coil 112d and the capacitor 112e. A signal (voltage) amplified by the amplifier 113b is output via the driving circuit 113c to the outside of the fluxmeter 110.

The driving circuit 113c applies a modulation of several hundred kHz to the SQUID ring 112b using the modulation coil 112c and further feeds the result obtained through a synchronous wave detection of the modulation output component from the SQUID ring 112b, back to the SQUID ring 112b by use of the modulation coil 112c. Thus, an output voltage proportional to the flux which enters the SQUID ring 112b can be obtained while maintaining the flux in the SQUID ring 112b at constant.

Again with reference to FIG. 3, the structure of the multichannel flux measuring apparatus will now be described. The signal processing circuit 120 receives signals (the signals proportional to the flux entering the SQUID ring 112b) output from all the fluxmeters 110 (110-1 to 110-N) provided in the multichannel flux measuring apparatus shown in FIG. 3, and outputs the signals of the fluxmeters 110 in parallel to the data collecting unit 130. If necessary, the signal processing circuit 120 carry out a predetermined process on the signals received, for example, in the case where an object to be measured is the brain of a living body, the circuit converts a received signal into a brain magnetic signal.

As shown in FIG. 3, the data collecting portion 130 includes an A/D (analog/digital) converter 131, a data recording section 131 and a crosstalk compensation unit 133. The data recording section 132 converts a analog signal sent from the signal processing circuit 120 into a digital signal. The data recording section 132 has a non-volatile recording medium such as a hard disk or an optical disk, and serves to record/save the data (digital data) converted by the A/D converter 131. The crosstalk compensation section 133 performs the compensation of the data recorded/stored in the data recording section 132, in order to remove the interference due to the crosstalk of each fluxmeter 110, that is, each channel.

To the data collection unit 130, the display 140 and the data analysis section 150 are connected. The display 140 is a displaying device such as a CRT (cathode ray tube), and displays the data compensated by the crosstalk compensation section 133 in the form of magnetic field distribution or time waveform, or the like. The data analysis section 150 performs a process for obtaining the distribution of one or more current sources in a living body. It is also possible that the data analyzed by the data analysis portion 150 is displayed on the display 140.

The compensating process of removing the interference due to the crosstalk, by the crosstalk compensation section 133, will now be described.

Figure 5A:
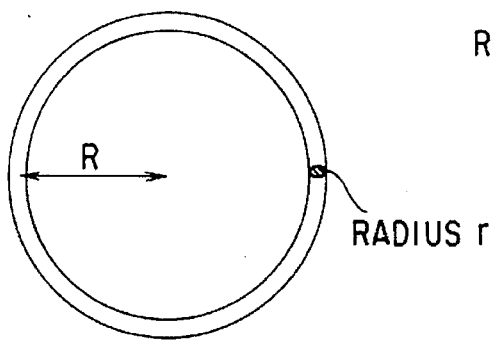
FIGS. 5A and 5B are diagrams illustrating the method of calculating the self inductance in the case where a one-wire circular coil and a one-wire square coil are applied to a pick-up coil of the multichannel magnetic flux measuring apparatus shown in FIG. 3.
Figure 5B:
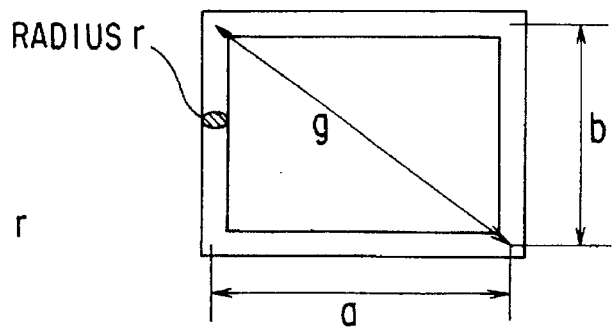

For example, it is known that the self inductance of the one-wire circular coil shown in FIG. 5A is calculated from the following formula (1), and the self inductance of the one-wire square coil shown in FIG. 5B is calculated from the following formulas (2) and (3).

$$L = 4\pi \times 10^{-7} R \left\{ \log_e \left[ \frac{8R}{r} \right] - 2 + \delta \right\} \quad (1)$$

$$L = 4\pi \times 10^{-7} \left\{ (a+b)\log_e \left[ \frac{2ab}{r} \right] - a \log_e(a+g) - \right.$$
$$\left. b \log_e(b+g) + 2(g+r) - (2-\delta)(a+b) \right\} \quad (2)$$

$$g = \sqrt{a^2 + b^2} \quad (3)$$

In the above formulas (1) and (2), $\gamma$ represents a frequency compensation coefficient (of electromagnetic wave).

With the above formulas, the self inductance of the pick-up coil shown in FIG. 6 can be calculated from the formula (1) or (2), or the combination thereof. Therefore, the self inductance of the pick-up coil shown in FIG. 6 is calculated from the following formula (4).

$$L = 2 \cdot [4\pi \times 10^{-7} R \left\{ \log_e \left[ \frac{8R}{r} \right] - 2 + \delta \right\} + M_{cc} \quad (4)$$

In the above formula (4), $M_{cc}$ represents a mutual inductance between coils and this mutual inductance is calculated form the following formula (5). $M_{cc}$ may be a negative value. In general, $M_{cc}$ is neglected.

$$M_{12} = \frac{\mu_0}{4\pi} \phi l_1 \phi l_2 d_{s2} d_{s1} \frac{\cos(\theta_{12})}{r_{12}} \quad (5)$$

In the above formula (5) which is called Neumann equation, the mutual inductance between the close circuits s1 and s2 made of fine wires, is calculated.

Figure 7:
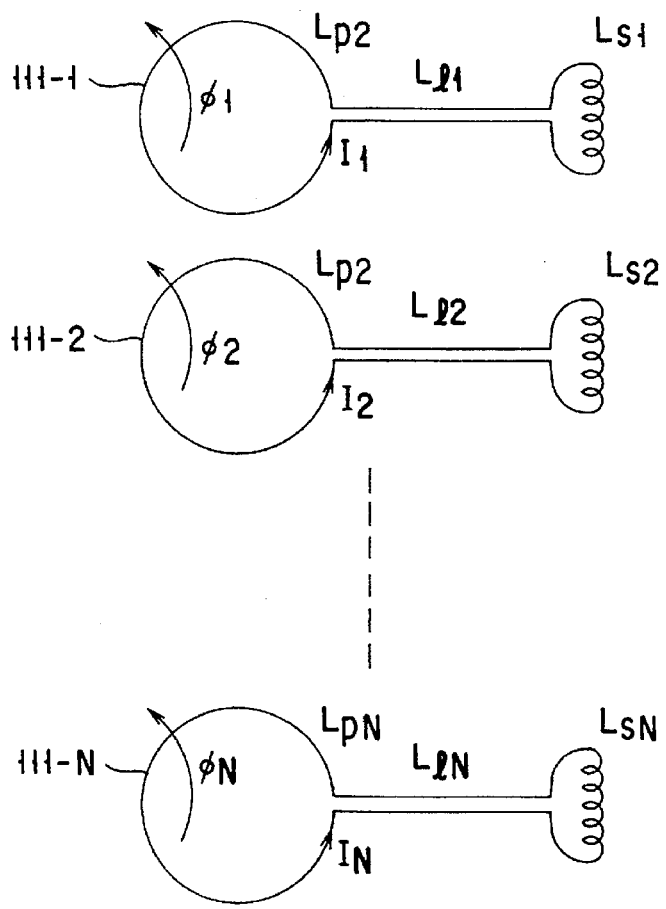
FIG. 7 is a diagram illustrating the method of calculating a mutual inductance between a plurality of pick-up coils of the multichannel flux measuring apparatus shown in FIG. 3.

In the case where the mutual inductance between channels is neglected (crosstalk is not considered), the total flux linked with superconducting flux transformers each consisting of a pick-up coil, wiring and an input coil as shown in FIG. 7, becomes 0. FIG. 7 is a schematic diagram showing a pick-up coil and an input coil. It is considered that the sum of the flux linked with a pick-up coil from outside (object of flux measurement) and the flux generated by the screening current which flows as if it cancels the linked flux, is 0. Therefore, the following formula (6) is obtained.

$$\phi'_i + (L_{pi} + L_{si} + L_{ti}) I_i = 0 \quad (6)$$

In the formula (6), $\phi'_i$ represents flux entering from outside into a pick-up coil 111-i, which is the i-number-th one. $\phi'_i$ is the sum of flux $\phi_i$ linked within the pick-up coil 111-i if there is no interference by crosstalk and flux $\phi''_i$ linked within the pick-up coil 111-i due to the interference by crosstalk. Therefore, the flux $\phi'_i$ can be obtained as follows:

$\phi_i' = \phi_i + \phi_i''$

The parameter $L_{pi}$ represents a self inductance of the i-number-th pick-up coil 111-i, $L_{si}$ represents a self inductance of the i-number-th SQUID chip 112-i, $L_{li}$ represents a self inductance of the wiring of the i-number-th superconducting flux transformer, and $I_i$ is a current flowing to the i-number-th superconducting flux transformer, that is, a current flowing commonly through the first pick-up coil 111-1 and the i-number-th input coil (the input coil 112a of the SQUID chip 112-i). The above inductance of wiring includes an inductance of wiring connecting the pick-up coil and SQUID chip, an inductance of soldering or screw setting portion on the SQUID chip to connect the wiring and the input coil, and an inductance of wiring between loops of the pick-up coil.

The current Ii flowing to the i-number-th SQUID chip 112-i can be obtained from the following formula (7).

$$I_i = -\frac{\phi'_i}{L_{pi} + L_{si} + L_{li}} \tag{7}$$

In the case where the mutual inductance between channels is considered, the formula (6) is rewritten into the following formula (8) with an addition of the item of interaction.

$$\phi_i + (L_{pi} + L_{si} + L_{li})I_i + \sum_{j=1, j\neq i}^{N} M_{ij} I_j = 0 \tag{8}$$

In this formula, $\phi_i$ represents flux from the object to be measured, and does not contain a linked flux due to the interference by crosstalk. $M_{ij}$ represents a mutual inductance between the i-number-th pick-up coil (SQUID chip) and the J-number-th pick-up coil (SQUID chip), and N represents the number of channels.

When the formula (7) is substituted in the formula (8), the following formula (9) is obtained. When the formula (9) is expressed in a vector formula, the formula (10) is obtained.

$$\phi_i = \phi'_i + \sum_{j=1, j\neq i}^{N} \frac{M_{ij}}{L_{pi} + L_{si} + L_{li}} \phi'_i \tag{9}$$

$$\Phi = A\Phi' \tag{10}$$

$$\Phi = \begin{bmatrix} \phi_1 \\ \phi_2 \\ \phi_3 \\ \cdot \\ \cdot \\ \cdot \\ \phi_N \end{bmatrix}, \phi' = \begin{bmatrix} \phi_1 \\ \phi_2 \\ \phi_3 \\ \cdot \\ \cdot \\ \cdot \\ \phi_N \end{bmatrix} \tag{11}$$

$$A_{ij} = \begin{cases} 1 & (i=j) \\ \dfrac{M_{ij}}{L_{pi} + L_{si} + L_{li}} & (i \neq j) \end{cases} \tag{12}$$

A flux vector $\Phi$ which is free of the interference by crosstalk and is from only an actual object to be measured, and a total flux vector $\Phi'$ containing the interference by crosstalk can be given by the above formula (11). Each factor $A_{ij}$ of an N×N matrix A is given by the formula (12). In order to obtain $A_{ij}$, the values of $L_{pi}$, $L_{si}$, $L_{li}$ and $M_{ij}$ are required. These values are obtained by measurement or by calculation according to the formulas (1), (2), and (5). In the case of wherein the values are obtained by calculation, the self inductance $L_{pi}$ is obtained from the formulas (1) and (2) as mentioned above, and the self inductance $L_{si}$, the inductance of wiring $Ll_i$, and the mutual inductance $M_{ij}$ are known; therefore a compensation matrix $A_{ij}$ can be obtained.

The interference by crosstalk can be eliminated by performing the calculation of the formula (10) using the compensation matrix A. The crosstalk compensation section 133 carries out the process represented by the formula (10) on the input data, using the compensation matrix A, thus making it possible to eliminate the interference by crosstalk between pick-up coils.

Next, the entire operation of the multichannel flux measuring apparatus according to the first embodiment will now be described.

The flux of the magnetic field generated from an object P, which links with the pick-up coils 111 of the fluxmeters 110 (110-1 to 110-N), is converted into electrical signals by each of the pick-up coils 111 via the SQUID chips 112 driven by the FLL circuits 113.

The electrical signals output from the fluxmeters 110 (110-1 to 110-N) are transferred to the data collecting unit 130 via the signal processing circuit 120. In the data collecting unit 130, the electrical signals are converted into digital data by the A/D converter 131. The converted digital data are recorded on a hard disk or a magnet-optical disk or the like, of the data recording section 132. The digital data recorded on the data recording medium is subjected to the compensation process, in which the interference by crosstalk of each channel is eliminated by the crosstalk compensation section 133. More specifically, in the crosstalk correction section 133, the self inductance and the mutual inductance of each pick-up coil 111 (111-1 to 111-N) are theoretically calculated, thus obtaining a crosstalk compensation array, and a compensation process is carried out with use of the cross talk compensation array. The compensated data are displayed on the display 140 directly in the form of a magnetic field distribution or time waveform, and sent to the data analysis section 150. The data sent to the data analysis section 150 are subjected to a process for obtaining a current source distribution in a living body or the like, and then displayed on the display 140.

As described above, in the first embodiment, the crosstalk compensation section 133 is provided in the data collection unit 130 for collecting signals output from the fluxmeters 110 (110-1 to 110-N) each constituting a single channel, and the section 133 is designed for eliminating, as a compensation, the interference by crosstalk, mixedly present in digital data obtained from these signals. Thus, a crosstalk created between pick-up coils 111 (111-1 to 111-N) is compensated, and only the flux free of the interference by the crosstalk can be measured from an object. The first embodiment is effective for the magnetic interaction between pick-up coils, which is the main factor of crosstalk. According to this embodiment, the interference by crosstalk can be eliminated without increasing the interval between pick-up coils, or decreasing the diameter of each pick-up coil, that is, without deteriorating the accuracy of the flux measurement or the magnetic field measurement.

Since the interference by crosstalk can be removed, the area of each pick-up coil can be increased in order to improve the S/N ratio of a signal corresponding to a magnetic field to be measured. Or, for example, the pick-up coils may be formed to have a pentagonal or hexagonal shape as shown in FIGS. 8A and 8B, or the pick-up coils may be arranged so as to be close (adjacent) to each other during a measurement as shown in FIGS. 8C and 8D.

Next, the multichannel flux measuring apparatus according to the second embodiment of the present invention will now be described.

The structure of the multichannel flux measuring apparatus according to the second embodiment is similar to that of the first embodiment. More specifically, the second embodiment is also a multichannel magnetic flux measuring apparatus in which a plurality (the M number in the second embodiment) of fluxmeters 110 (110-1 to 110-M) each constitute a channel. However, the crosstalk compensation section 133 carries out a process different from that of the first embodiment, to data measured by each fluxmeter 110 for decreasing the interference by crosstalk mixedly present in the data. In this embodiment, the structural elements are designated by the reference numerals used in the first embodiment, and a detailed description of each structural element, except for the crosstalk compensation section 133, will be omitted. As mentioned above, the number of channels is M.

In the first embodiment described before, the crosstalk compensation section 133 theoretically calculates out a crosstalk compensation matrix from the self inductance and the mutual inductance of each of the pick-up coils 111 (111-1 to 111-N). In the second embodiment, as will be described later, the known magnetic field generating source is measured and the compensation matrix A is calculated from the measurement result. The process of the crosstalk compensation section 133 of the second embodiment will now be described.

A magnetic field generating source is located at a predetermined position, and flux actually measured by one of the channels at the location is designated as a vector $\Phi_1'$. Further, flux which is supposed to be theoretically measured by that one of the channels is designated as $\Phi_1$. It should be noted that the flux $\Phi_1$ theoretically obtained, can be obtained from the magnetic field generating source (current source) which generates the known magnetic field, and the distance between the current source and the location of a measurement.

Next, the location of the magnetic field generating source is moved, and flux actually measured at that location by one of the channels is designated as a vector $\Phi_2'$. Further, flux which is supposed to be theoretically measured by that one of the channels is designated as $\Phi_2$.

In a similar manner, the location of the magnetic field source is further moved a number of times, and the flux is measured at these locations a total of the M-number of times (equal to the number of channels). The flux actually measured at these channels is designated as vectors $\Phi_3', \Phi_4', \ldots, \Phi_M'$, whereas the theoretically calculated flux for these channels is designated as $\Phi_3, \Phi_4, \ldots, \Phi_M$. The compensation matrix A is given by a product of an M×M matrix constituted by $\Phi_1, \Phi_2, \ldots, \Phi_M$, and an inverse matrix of the M×M matrix constituted by $\Phi_1', \Phi_2', \ldots, \Phi_M'$, that is, the following formula (13).

$$A = (\Phi_1\ \Phi_2\ \ldots\ \Phi_M)(\Phi_1'\ \Phi_2'\ \ldots\ \Phi_M')^{-1} \quad (13)$$

As described above, the measurement is carried out using the known magnetic field generating sources for the M-number of times (equal to the number of channels), and the interference by crosstalk is removed with use of the compensation matrix A given by the above formula (13).

It should be noted that the measurement can be carried out the M-number of times or more (though it is not recommended, it may be less than the M-number of times). For example, in the case where the measurement is carried out for the K-number (K=M+m, m>0) of times, the flux actually measured at the channels is designated as vectors $\Phi_1', \Phi_2', \ldots, \Phi_K'$, whereas the theoretically calculated flux for these channels is designated as $\Phi_1, \Phi_2, \ldots, \Phi_K$. The compensation matrix A is given by a product of an M×K matrix constituted by $\Phi_1, \Phi_2, \ldots, \Phi_K$, and an inverse matrix of the M×K matrix constituted by $\Phi_1', \Phi_2', \ldots, \Phi_K'$, that is, the following formula (14).

$$A = (\Phi_1\ \Phi_2\ \ldots\ \Phi_K)(\Phi_1'\ \Phi_2'\ \ldots\ \Phi_K')^+ \quad (14)$$

It should be noted that $(\Phi_1', \Phi_2', \ldots, \Phi_K')^+$ is a generalized inverse matrix (K×M matrix) of M×K matrix $(\Phi_1', \Phi_2', \ldots, \Phi_K')$, and the Moore-Penrose type generalized inverse matrix is recommended as this general inverse matrix. In the case where the number of times of measurement is M or more, the measurement noise is reduced, and therefore the compensation matrix can be obtained at a higher accuracy.

As described above, the crosstalk compensation section 133 obtains a compensation matrix A in advance from known (theoretical) flux and an actually measured matrix, and carries out the compensation process with use of the compensation matrix A.

With the crosstalk compensation section 133 which carries out the crosstalk compensation process, only the flux which is free of the interference by crosstalk can be measured from an object as in the first embodiment. Especially, the second embodiment is effective for all the crosstalk factors between the fluxmeters, which contains the magnetic interaction between pick-up coils. Therefore, naturally, the interference by crosstalk can be eliminated without conducting a particular treatment such as increasing the interval between pick-up coils or reducing the diameter of each pick-up coil. Therefore, the interference by crosstalk can be removed without deteriorating the accuracy of the flux measurement or the magnetic filed measurement.

The operation of the second embodiment is the same as that of the first embodiment except for the above-described operation of the crosstalk compensation section 133, and therefore a detail description thereof will be omitted.

Further, in the first and second embodiments, the data collection unit 130 has a structure in which the crosstalk compensation section 133 is provided. However, it is also possible that the data collection unit 130 is formed of an A/D converter 131 and a data recording section 132, and the crosstalk compensation section 133 is provided in the data analysis section 150.

Further, it is required in some cases that the A/D conversion, the crosstalk compensation and the recording should be carried out at real time, as an apparatus for measuring the magnetic field of a living body. In such a case, it only suffices if the multichannel flux measuring apparatus according to the first and second embodiments are remodeled by replacing the data collection unit 130 with a data collection unit 230 having such a structure as shown in FIG. 9.

The above-described first and second embodiments have a structure in which the crosstalk compensation section 133 is provided between the data recording section 132 and the data analysis section 150, so as to eliminate the interference by crosstalk, as a compensation, prior to the analysis of data read from the data recording section 132. In contrast, the data collection unit 230 shown in FIG. 9 has a structure in which a crosstalk compensation section 232 is provided between an A/D converter 231 and a data recording section 233 so as to remove, by the crosstalk compensation section 232, the interference by crosstalk from digital data obtained by A/D-converting signals from each of channels by the A/D converter 231, and then thus obtained data are recorded in the data recording section 233. The data read out from the data recording section 233 can be analyzed directly by the data analysis section 150.

In the first and second embodiments, DC-SQUIDs which can be operated by a DC bias; however, for example, RF-SQUIDs each of which has one Josephson element and is used with application of an AC bias of 15–200 MHz, may be applied.

Further, in the first and second embodiments, the primary differential coil shown in FIG. 6 is used as the pick-up coil;

however the present invention is not limited to these embodiments, a 0-order differential magnetometer or a secondary differential gradiometer or the like can be applied.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A flux measuring apparatus comprising:

a plurality of measuring means, each of the measuring means having a pick-up coil and detection means which is formed of a superconductor quantum interference device, SQUID, and for measuring a magnetic flux linked with said pick-up coil; and compensation means for compensating an interference due to a crosstalk between said pick-up coils of said plurality of measuring means included in a measured value from said plurality of measuring means, said compensation means comprises means for calculating a product $A\Phi'$, where the A is a compensation matrix and the $\Phi'$ is the measured value, to obtain a flux vector $\Phi$ which is free of the crosstalk interference, said compensation matrix A is based on a self inductance of each pick-up coil and a mutual inductance between pick-up coils of said plurality of measuring means, wherein said detection means includes an input coil connected to said pick-up coil, and said compensation means, when flux detected by said plurality of magnetic detection means is $\Phi_i'$, compensates the flux $\Phi_i'$ on the basis of the following equation:

$$\phi_i = \phi'_i + \sum_{j=1, j \neq i}^{N} \frac{M_{ij}}{L_{pi} + L_{si} + L_{li}} \phi'_i$$

and obtains flux $\Phi_i$ which is free from an interference due to crosstalk, where N represents the number of said plurality of measuring means, i and j each are an arbitrary numeral from 1 to N, $\Phi_i'$ represents flux detected by the i-number-th detection means, $M_{ij}$ represents a mutual inductance between the i-number-th pick-up coil and the j-number-th pick-up coil, $L_{pi}$ is a self inductance of the i-number-th pick-up coil, $L_{si}$ represents a self inductance of the i-number-th input coil, and $L_{li}$ represents a self inductance of wiring of the i-number-th measuring means.

2. A flux measuring apparatus comprising:

a plurality of measuring means, each of the measuring means having a pick-up coil and detection means which is formed of a superconductor quantum interference device, SQUID, and for measuring a magnetic flux linked with said pick-up coil;

compensation means for compensating an interference due to a crosstalk between said pick-up coils of said plurality of measuring means included in a measured value from said plurality of measuring means, said compensation means comprises means for calculating a product $A\Phi'$, where the A is a compensation matrix and the $\Phi'$ is the measured value, to obtain a flux vector $\Phi$ which is free of the crosstalk interference, said compensation matrix A is based on a self inductance of each pick-up coil and a mutual inductance between pick-up coils of said plurality of measuring means; and means for calculating a distribution of a current source within a measured object, and wherein the flux vector $\Phi$ is obtained by said compensation means.

3. A flux measuring apparatus comprising:

a plurality of measuring means, each of the measuring means having a pick-up coil and detection means which is formed of a superconductor quantum interference device, SQUID, and for measuring a magnetic flux linked with said pick-up coil; and compensation means for compensating an interference due to a crosstalk between said pick-up coils of said plurality of measuring means included in a measured value from said plurality of measuring means, said compensation means comprises means for calculating a product $A\Phi'$, where the A is a compensation matrix and the $\Phi'$ is the measured value, to obtain a flux vector $\Phi$ which is free of the crosstalk interference, said compensation matrix A is based on a theoretical value of flux of a known current source and a measured value of flux of the known current source measured by said measuring means.

4. A flux measuring apparatus according to claim 3, wherein said superconducting quantum interference element of said detection means is a DC-SQUID which is driven by DC bias.

5. A flux measuring apparatus according to claim 3, wherein the pick-up coils of said plurality of measuring means are polygonal, and said pick-up coils are arranged so as to be close to an object to be measured.

6. A flux measuring apparatus according to claim 3, wherein said compensation means, when a known flux vector is $\Phi_i$ and flux detected by said plurality of measuring means is $\Phi_i'$, compensates the flux $\Phi_i'$ with use of the following compensation matrix A:

$$A = (\Phi_1\ \Phi_2\ \ldots\ \Phi_K)(\Phi_1'\ \Phi_2'\ \ldots\ \Phi_K')^+$$

where the symbol + represents a generalized inverse matrix, K represents the number of times of measurement and i is a numeral for 1 to K.

7. A flux measuring apparatus according to claim 3, further comprising:

means for calculating a distribution of a current source within a measured object and the flux vector $\Phi$ is obtained by said compensation means.

8. A flux measuring apparatus according to claim 6, wherein said number K of times of measurement is the number of said plurality of measurement means or more.

* * * * *